United States Patent
Tanaka

(10) Patent No.: US 6,746,955 B2
(45) Date of Patent: Jun. 8, 2004

(54) METHOD OF MANUFACTURING A SEMICONDUCTOR DEVICE INCLUDING A HEAT TREATMENT PROCEDURE

(75) Inventor: Yasuo Tanaka, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/305,247

(22) Filed: Nov. 27, 2002

(65) Prior Publication Data

US 2003/0228767 A1 Dec. 11, 2003

(30) Foreign Application Priority Data

Jun. 6, 2002 (JP) ........................... 2002-165824

(51) Int. Cl.[7] .................... H01L 21/44; H01L 21/31
(52) U.S. Cl. ................. 438/660; 438/687; 438/770
(58) Field of Search .................. 438/660, 687, 438/770

(56) References Cited

U.S. PATENT DOCUMENTS 6,323,435 B1 * 11/2001 Strandberg et al. ......... 174/255
6,373,717 B1 * 4/2002 Downes et al. ............. 361/795

FOREIGN PATENT DOCUMENTS

| JP | 2001-127095 | 5/2001 |
| JP | 2001-244372 | 9/2001 |

* cited by examiner

Primary Examiner—Amir Zarabian
Assistant Examiner—Toniae M. Thomas
(74) Attorney, Agent, or Firm—Volentine Francos, PLLC

(57) ABSTRACT

A method of manufacturing a semiconductor device includes forming copper conductive patterns on an insulating layer formed on a semiconductor base, ashing the whole insulating layer including the copper conductive patterns at a temperature at which no oxide film is formed on the copper conductive patterns, and thereafter baking the whole insulating layer including the copper conductive patterns in an oxidative atmosphere at a temperature range of about 150° C. to about 200° C. After the baking step, an encapsulating resin is formed on the insulating layer including the copper conductive patterns.

20 Claims, 2 Drawing Sheets

FIG. 2

RELATIONSHIP BETWEEN THICKNESS OF OXIDE FILM AND INTERFERENCE COLORS

| COLOR | THICKNESS | | | | 100°C | 150°C | 180°C | 200°C | 220°C | 240°C |
|---|---|---|---|---|---|---|---|---|---|---|
| COLOR OF BARE Cu | — | — | — | — | | | | | | |
| Brown | — | — | — | — | No change over 1H*1 | 240s | — | — | — | — |
| Dark Brown | 200-350 | 370 | 380 | 190 | — | Greater than or equal to 900s | 40s | 30s | 10s | 8s |
| Auburn | 300-400 | 410 | 420 | 230 | — | — | 80s | 37s | 20s | 16s |
| Purple | 350-450 | 460 | 450 | 340 | — | — | 100s | 45s | 23s | 18s |
| Blue | 400-500 | 520 | 500 | 410 | — | — | 110s | 51s | 28s | 23s |
| Green | 600-800 | | | | — | — | 300s | 70s | 35s | 30s |
| Yellow | 800-1000 | 940 | 980 | 760 | — | — | 420s | 85s | 41s | 44s |
| Orange | 1000-1200 | | | | — | — | 600s | 120s | 80s | 55s |
| Red | 1100-1500 | 1240 | 1260 | — | — | — | — | 420s | 110s | — |
| Source or Measurer | Kobe Steel | Miley | Carstable | Campbell | | | | | | |

*1 Result obtained when vacuum oven is used.
Except of it, results obtained on hot plate.

METHOD OF MANUFACTURING A SEMICONDUCTOR DEVICE INCLUDING A HEAT TREATMENT PROCEDURE

BACKGROUND OF THE INVENTION

The present invention relates to a method of manufacturing a semiconductor device using an organic substrate or the like and particularly to a method of sealing a chip size package (CSP) at a wafer level with a resin.

While a variety of types are known for wafer levels CSP, a wafer level CSP with an encapsulating layer, which makes use of a rewiring technology, will now be described by way of example. Incidentally, the wafer level CSP with the encapsulating layer utilizing the rewiring technology has been disclosed in, for example, Japanese Patent Application Laid-Open No. 2001-244372, 2001-127095, etc.

In such a wafer level CSP, each of semiconductor chips on a semiconductor wafer includes metal pads disposed at its peripheral portion. An insulating layer is formed on the metal pads. Copper posts are formed on the insulating layer placed inside the metal pads. The metal pads and the copper posts are electrically connected to one another by copper conductive patterns. Since the copper conductive patterns are routed for connection to the copper posts over the insulating layer via the insulating layer, they are called "rewirings".

Thereafter, an encapsulating resin such as a thermosetting epoxy is formed so as to cover the copper conductive patterns and the side faces of the copper posts. With a view toward improving the adhesion between the encapsulating resin and the insulating layer and the adhesion between each of the copper conductive patterns and its corresponding copper post, ashing or an ashing process is effected on the insulating layer, copper conductive patterns and copper posts by an argon gas, an oxygen gas or the like.

This ashing is generally done in a short period of time equivalent to within one minute at a temperature of 100° C. or less. The exposed copper conductive patterns and copper posts are considered to be oxidized owing to such ashing in principle. While, however, its mechanism is unknown, an oxide film is actually almost unformed on the surfaces of the exposed copper conductive patterns and copper posts.

However, such ashing encounters difficulties in simultaneously ensuring both the adhesion between the insulating layer and the encapsulating resin and the adhesion between the copper and the encapsulating resin. Even if only one thereof is taken into consideration, it is difficult to ensure the adhesion between the insulating layer high in adsorbability in particular and the encapsulating resin or between the copper and the encapsulating resin.

This is ascribable to the fact that conditions for ashing are different according to materials for the insulating layer and the encapsulating resin, and adjustments thereto are difficult, particularly, the optimization of the adhesion to the copper becomes difficult.

A problem also arises in that a condition for storing a post-ashing wafer, and a restriction up to resin encapsulation are provided, and the degree of adhesion to the copper is hardly obtained when how to handle the wafer is poor.

SUMMARY OF THE INVENTION

The present invention aims to solve the foregoing problems. It is an object of the present invention to provide a method of manufacturing a semiconductor device, which is capable of simultaneously ensuring both the adhesion between an insulating layer and an encapsulating resin and the adhesion of copper and the encapsulating resin.

A method of manufacturing a semiconductor device, according to the present invention is characterized by forming copper conductive patterns on an insulating layer formed on a semiconductor base, ashing the whole insulating layer including the copper conductive patterns at a temperature at which the copper conductive patterns are not subject to oxidation, and thereafter baking the whole insulating layer including the copper conductive patterns in an oxidative atmosphere at over 150° C. to under 200° C. After this baking step, an encapsulating resin is formed on the insulating layer including the copper conductive patterns.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 2 is a diagram illustrating a relationship between the thickness of copper oxide formed on a copper surface and interference colors and a relationship among temperatures, time and interference colors at the time that heat is applied by a vacuum oven.

DETAILED DESCRIPTION OF THE PREFERRED EMBODIMENTS

Figure 1:
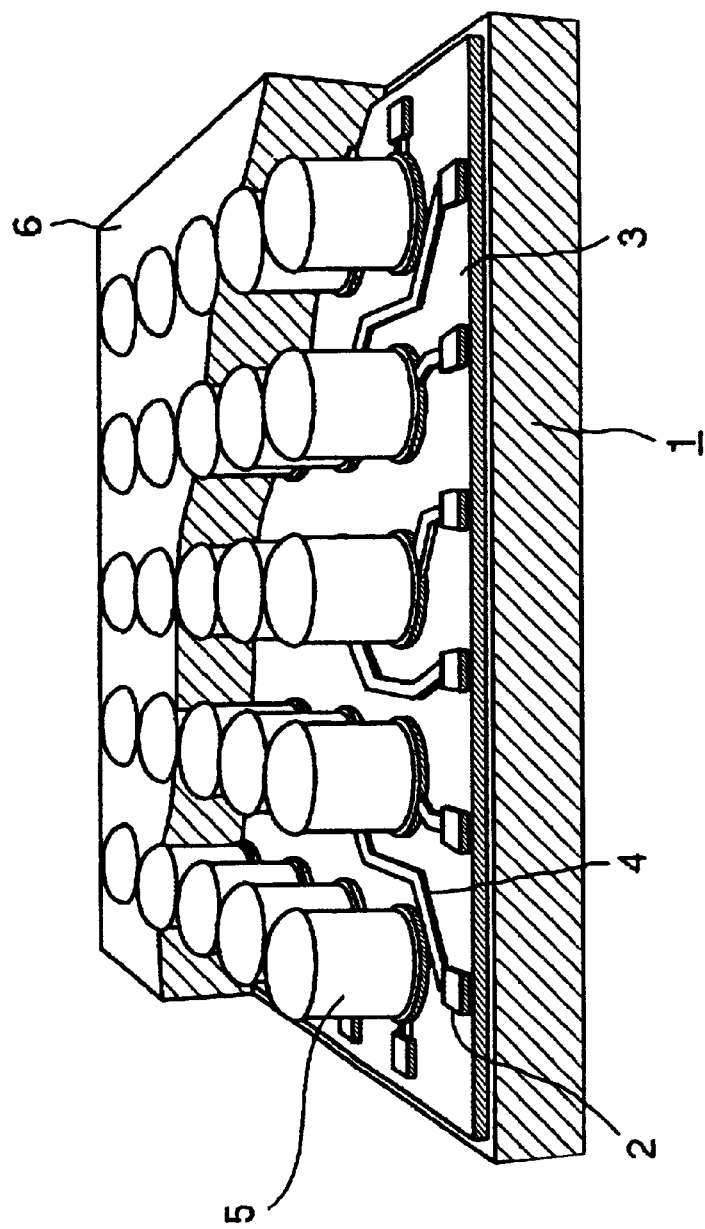
FIG. 1 is a partial cross-sectional view of a semiconductor device fabricated by a manufacturing method of the present invention.

An outline of a manufacturing method of the present invention will first be described.

FIG. 1 is a partial cross-sectional view of a semiconductor device fabricated by a manufacturing method of the present invention. Incidentally, while FIG. 1 shows a semiconductor device in each individual chip state, it is assumed that the present invention is carried out in a state of a semiconductor wafer prior to being separated into chips. Of course, it is needless to say that the present invention can be implemented even at individual chip levels.

Semiconductor elements are formed on a main surface (upper side of FIG. 1) of a semiconductor chip 1 and metal pads 2 are provided at their peripheral portions. Thereafter, the main surface of the semiconductor chip 1 is covered with an insulating layer 3. Polyimide or the like is used as the insulating layer 3. Copper rewirings 4 electrically connected from their corresponding metal pads 2, and copper posts 5 electrically connected to their corresponding metal pads 2 by the copper rewirings 4 are formed on the insulating layer 3.

Afterwards, ashing is effected on the insulating layer 3, copper rewirings 4 and copper posts 5 by an argon gas, an oxygen gas or the like in order to improve the adhesion between the encapsulating resin 6 and each of the insulating layer 3, copper rewirings 4 and copper posts 5 as described above. This ashing is carried out at a low temperature of 100° C. or less in a short period of time equivalent to within one minute.

Further, baking or a baking process corresponding to a characterized portion of the present invention is effected on the insulating layer 3, copper rewirings 4 and copper posts 5. Although described in detail later, the temperature for baking may preferably range from over 150° C. to under 200° C., more preferably be recommended to range from over 160° C. to under 190° C. This baking is done in an oxidative atmosphere (e.g., dry air) so that the copper rewirings 4 and copper posts 5 are slightly oxidized. Consequently, an oxide film ranging from about 300 to about 400 Å is formed on their surfaces. Incidentally, it has been confirmed that if the baking is carried out in an oxidation-unadvanced atmosphere (e.g., oxygen gas) before the baking in the above oxidative atmosphere, a further effect can be expected.

After such baking has been done, the insulating layer 3, the copper rewirings 4 and the copper posts 5 are covered with a resin 6 such as epoxy, whereby the semiconductor device is completed. Incidentally, when the present invention is applied in the wafer state, it is needless to say that a process step for separating the wafer into individual pieces is necessary.

Before the description of an embodiment of the present invention, a description will next be made of a relationship between the thickness of copper oxide formed on a copper surface and interference colors, and a relationship among temperatures, time and interference colors at the time that heat is applied by a hot plate.

FIG. 2 is a diagram showing a relationship between the thickness of copper oxide formed on the surface of copper and interference colors, and a relationship among temperatures, time and interference colors at the time that heat is applied by a vacuum oven. As is understood from FIG. 2, the copper shows metal colors (represented as the colors of bare Cu) peculiar to copper if no oxide film is formed on the surface thereof. As, however, the oxide film is formed on the surface thereof and the thickness of the oxide film becomes large, the color of the copper changes into brown, dark brown, auburn, purple, blue, green, yellow, orange and red in this order. While the thickness of the oxide film formed on the copper surface with respect to each color slightly varies depending on measurers, the order of the colors is coincident with the above. The variations in thickness also fall within a range of approximately 200 Å.

On the other hand, a result showing what changes in color appear when copper is heated, is represented on the right side of FIG. 2. When copper is heated at 100° C.(incidentally, a vacuum oven is used only when copper is heated at 100° C.), no change in color was seen or confirmed even after one hour or more has elapsed. When copper is heated at 150° C., no change in color was seen for about 240 seconds but copper has changed into brown in about 900 seconds. Results obtained by executing such processing at 180° C., 200° C., 220° C. and 240° C. are shown in FIG. 2.

It is understood from this Table that the oxide film can be formed with good controllability when the oxidation temperature of copper ranges from about 150 to about 200° C.

Next, the present inventors have conducted an experiment for effecting baking on copper and an insulating film prior to ashing. The baking was conducted while conditions were being changed as in the case of temperatures between 150° C. and 200° C. in about 15 to about 30 minutes. However, the insulating layer and encapsulating resin, and the copper and encapsulating resin were little changed in adhesion therebetween. Thus, the present inventors have considered that baking prior to ashing is low in effect, and have carried out an experiment from another point of view.

The present inventors have carried out an experiment for effecting baking after ashing. Upon this experiment, a thermosetting epoxy resin was used as the encapsulating resin. The baking was done with a clean oven and carried out while conditions were being changed as in the case of temperatures between 165° C. and 240° C. in about 10 to 45 minutes. Upon this experiment, the surface of copper is abruptly oxidized at high bake temperatures such as 220° C., 240° C., etc. It is thus difficult to control the thickness of the oxide film. Further, this will exert a bad influence on the adhesion between the insulating layer and the encapsulating resin and the adhesion between the copper and the encapsulating resin.

On the other hand, since the surface of copper turns from auburn to purple upon a relatively low-temperature bake process at a temperature of from about 165 to about 180° C. for about 10 minutes, it is estimated that an oxide film of about 300 to about 400 angstroms is formed on the copper surface. At this time, the adhesion between the insulating layer and the encapsulating resin and the adhesion between the copper and the encapsulating resin are improved as compared with the bake-free state, whereby an effect could be confirmed. It was also confirmed that heating in the neighborhood of 170° C. under a nitrogen atmosphere before the baking would produce a more advantageous effect.

Incidentally, while an effect of improvement was recognized in the baking process at the relatively low temperatures of about 165 to about 180° C. upon the experiment done by the present inventors, it was recognized that this experiment would exert a bad influence on the adhesion between the insulating film and the encapsulating resin when conditions for baking were worse. Therefore, the present inventors further carried out an experiment by paying attention to the adhesion between the insulating film and the encapsulating resin.

According to a further experiment, baking was done at a temperature of 150 to 200° C. in an oxidation-unadvanced nitrogen atmosphere after ashing for a time interval required until all of samples lying within a magazine reached the same temperature condition (about 45 minutes in the case of the present experiment). Further, the nitrogen atmosphere was replaced with a dry air atmosphere and baking was done at the same temperature for about 10 minutes. It is understood that the surface of copper is little discolored upon the baking in the nitrogen atmosphere (it might be partly discolored depending on the influence of the pre-process), and the oxide film is almost unformed on the surface of copper. On the other hand, it can be estimated that since the surface of copper turns auburn after the baking in the dry air atmosphere, an oxide film of 300 to 400 Å is formed on the surface of copper. Incidentally, it is found from the result of this experiment that both the adhesion between the insulating layer and the encapsulating resin and the adhesion between the copper and the encapsulating resin have reached satisfactory results of improvements. Even if conditions for the baking slightly vary, an effect of improvement was found not to vary widely.

According to the invention of the present application as described above in detail, since the adhesion between the insulating layer and the encapsulating resin and the adhesion between the copper and the encapsulating resin are improved, a method of manufacturing a semiconductor device, which is excellent in production yield, can be provided.

While the present invention has been described with reference to the illustrative embodiment, this description is not intended to be construed in a limiting sense. Various modifications of the illustrative embodiment, as well as other embodiments of the invention, will be apparent to those skilled in the art on reference to this description. It is therefore contemplated that the appended claims will cover any such modifications or embodiments as fall within the true scope of the invention.

What is claimed is:

1. A method of manufacturing a semiconductor device comprising:

forming an insulating layer on a semiconductor substrate;

forming a plurality of copper conductive patterns on the insulating layer;

ashing the insulating layer and the copper conductive patterns at a predetermined temperature so that the copper conductive patterns are not substantially oxidized;

baking the ashed insulating layer and the ashed copper conductive patterns in an oxidative atmosphere at a temperature range of about 150° C. to about 200° C.; and forming an encapsulating resin on the baked insulating layer and the baked copper conductive patterns.

2. The method according to claim 1, further comprising separating the semiconductor substrate having the encapsulating resin into a plurality of individual semiconductor devices.

3. The method according to claim 1, wherein each of the copper conductive patterns has a copper conductive line pattern and a copper post.

4. The method according to claim 1, wherein the baking is carried out at a temperature range of about 160° C. to about 190° C.

5. The method according to claim 1, wherein the baking is carried out for about 10 minutes.

6. The method according to claim 1, further including pre-baking the ashed insulating layer and the ashed copper conductive patterns in a nitrogen atmosphere at a temperature range of about 150° C. to about 200° C. before the baking.

7. The method according to claim 6, wherein the pre-baking is carried out for about 30 minutes to about one hour.

8. The method according to claim 1, wherein the ashing is carried out under about 100° C.

9. The method according to claim 1, wherein the insulating layer is formed of a highly absorbent insulating material.

10. The method according to claim 9, wherein the highly absorbent insulating material is polyimide.

11. A method of manufacturing a semiconductor device comprising:

providing a semiconductor substrate having an insulating layer thereon;

forming a plurality of copper conductive patterns on the insulating layer;

subjecting the insulating layer and the copper conductive patterns to a first heat treatment so that the copper conductive patterns are not substantially oxidized;

subjecting the first heat treated insulating layer and the first heat treated copper conductive patterns to a second heat treatment in an oxidative atmosphere at a temperature range of about 150° C. to about 200° C.; and forming an encapsulating resin on the second heat treated insulating layer and the second heat treated copper conductive patterns.

12. A method of manufacturing a semiconductor device according to claim 11, further comprising dividing the semiconductor substrate having the encapsulating resin into a plurality of individual semiconductor devices.

13. A method of manufacturing a semiconductor device according to claim 11, wherein each of the copper conductive patterns has a copper conductive line pattern and a copper post.

14. A method of manufacturing a semiconductor device according to claim 11, wherein the second heat treatment is carried out at a temperature range of about 160° C. to about 190° C.

15. A method of manufacturing a semiconductor device according to claim 11, wherein the second heat treatment is carried out for about 10 minutes.

16. A method of manufacturing a semiconductor device according to claim 11, further including performing a third heat treatment on the first heat treated insulating layer and on the first heat treated copper conductive patterns in a nitrogen atmosphere at a temperature range of about 150° C. to about 200° C.

17. A method of manufacturing a semiconductor device according to claim 16, wherein the third heat treatment is carried out for about 30 minutes to about one hour.

18. A method of manufacturing a semiconductor device according to claim 11, wherein the first heat treatment is carried out under about 100° C.

19. A method of manufacturing a semiconductor device according to claim 11, wherein the insulating layer is formed of polyimide.

20. A method of manufacturing a semiconductor device comprising:

providing a semiconductor substrate having a plurality of semiconductor elements formed thereon;

forming a first insulating layer on the semiconductor substrate;

forming a plurality of copper conductive patterns on the first insulating layer;

forming a plurality of copper posts on the copper conductive patterns, respectively;

subjecting the first insulating layer, the copper conductive patterns and the copper posts to a first heat treatment so that the copper conductive patterns and the copper posts are not substantially oxidized;

subjecting the first heat treated first insulating layer, the first heat treated copper conductive patterns and the first heat treated copper posts to a second heat treatment in an oxidative atmosphere at a temperature range of about 150° C. to about 200° C.; and forming a second insulating layer on the second heat treated first insulating layer, the second heat treated copper conductive patterns and the second heat treated copper posts so that tops of the second heat treated copper posts are exposed.

* * * * *